(12) United States Patent
Lin

(10) Patent No.: US 7,533,304 B2
(45) Date of Patent: May 12, 2009

(54) METHOD AND SYSTEM OF SIGNAL NOISE REDUCTION

(75) Inventor: Tung-Sheng Lin, Taipei Hsien (TW)

(73) Assignee: Wistron Corporation (TW)

( * ) Notice: Subject to any disclaimer, the term of this patent is extended or adjusted under 35 U.S.C. 154(b) by 762 days.

(21) Appl. No.: 11/294,567

(22) Filed: Dec. 6, 2005

(65) Prior Publication Data

US 2007/0043794 A1   Feb. 22, 2007

(30) Foreign Application Priority Data

Aug. 17, 2005   (TW) ............................... 94128096 A

(51) Int. Cl.
*G06F 11/00* (2006.01)
(52) U.S. Cl. ........................... 714/48; 714/47; 714/50; 714/51; 714/52

(58) Field of Classification Search ............. 714/47–52; 708/200
See application file for complete search history.

(56) References Cited

U.S. PATENT DOCUMENTS

2007/0263416 A1 * 11/2007 Tsai et al. ................. 363/21.03
2008/0162739 A1 *  7/2008 Krah et al. .................... 710/14
2008/0279283 A1 * 11/2008 Weinstock et al. ..... 375/240.24

* cited by examiner

*Primary Examiner*—Vibol Tan
(74) *Attorney, Agent, or Firm*—Bacon & Thomas, PLLC

(57) ABSTRACT

A method and system of signal noise reduction used for digital chips to prevent errors when signal noise occurs includes checking whether a recent received signal is logically consistent. If the recent signal is consistent, then the consistent signal is adopted. If the recent signal is not consistent, then a previous confirmed signal is adopted.

10 Claims, 6 Drawing Sheets

| No. | 1 | 2 | 3 | 4 | 5 | 6 | 7 |
|---|---|---|---|---|---|---|---|
| Sample | 1 | 1 | 1 | 0 | 0 | 0 | 0 |
| DebounceHigh | | | 1 | 0 | 0 | 0 | 0 |
| DebounceLow | | | 1 | 1 | 1 | 0 | 0 |
| StableSignal (Previous StableSignal=1) | | | 1 | 1 | 1 | 0 | 0 |

FIG. 6

| No. | 1 | 2 | 3 | 4 | 5 | 6 | 7 |
|---|---|---|---|---|---|---|---|
| Sample | 0 | 0 | 0 | 1 | 1 | 1 | 1 |
| DebounceHigh | | | 0 | 0 | 0 | 1 | 1 |
| DebounceLow | | | 0 | 1 | 1 | 1 | 1 |
| StableSignal (Previous StableSignal=0) | | | 0 | 0 | 0 | 1 | 1 |

FIG. 7

| Pins | p1 | p2 | p3 | p4 | p5 | p6 | p7 | p8 |
|---|---|---|---|---|---|---|---|---|
| Sample 1 | | | | | | | | |
| Sample 2 | ↓ | ↓ | ↓ | ↓ | ↓ | ↓ | ↓ | ↓ |
| Sample 3 | | | | | | | | |
| DebounceHigh | | | | | | | | |
| DebounceLow | | | | | | | | |
| StableSignal | | | | | | | | |

FIG. 10

METHOD AND SYSTEM OF SIGNAL NOISE REDUCTION

BACKGROUND OF THE INVENTION

1. Field of the Invention

The present invention relates to a method of signal noise reduction, and more particularly, to a method of signal noise reduction that may be applied to digital chips in a computer.

2. Description of the Related Art

Electrical signals from typical electronic devices, such as computers, often have signal bounce problem. In order to ensure correct signals, one method involves performing a delay process on a signal that may have noise. For example, when a digital signal changes (e.g. from 1 to 0), noise may occur. Please refer to FIG. 1. Between time t0 and t1, received digital signals D0 and D1 are both 1; at time t2, D2=0, which means the digital signal has changed. Therefore, at times t3, t4, regardless of what the signals D3 or D4 are, the received signal is still D1, until at time t5 if signal D5 is still 0, the received signal will then be changed from 1 to 0.

This method is usually applied for slower speed signals from general purpose input output (GPIO) ports, but can also be applied to higher speed signals, such as transmission signals between a CPU and a south bridge chip in a computer.

Please refer to FIG. 2. FIG. 2 is a schematic drawing of prior art technology processing changing time points for three pins P1, P2, P3. When the signal changes, after a period of delay, the signal can be confirmed. FIG. 2 shows that the signal changing time points of the three pins are usually different, and the traditional method of utilizing a delay time count for each pin P1, P2, P3 requires hardware resources and software that makes use of a timer. However, since there may be hundreds of GPIO pins, the computer must waste resources on support for the pins. Furthermore, when a GPIO pin is added, additional programs will be added, which is inefficient and which may cause numerous errors.

Therefore, it is desirable to provide a method of signal noise reduction to mitigate and/or obviate the aforementioned problems.

SUMMARY OF THE INVENTION

A main objective of the present invention is to provide a method of signal noises reduction which can reduce numbers of program code.

Another objective f the present invention is to provide a method of signal noises reduction which can perform signal confirmation on a plurality of pins.

In order to achieve the above-mentioned objectives, a method of signal noise reduction for a digital chip to prevent errors when signal noise occurs, the method comprising:

step A: checking whether a received recent signal and n previous signals are all consistent with digital logical operations, wherein n previous signals provide a first signal to an nth signal prior to the received recent signal, and $1 \leq n \leq 5$;

step B: determining a new confirmed signal with digital logical operations according to a previous confirmed signal and a result from step A as follows:

condition 1: when the result from step A indicates the received recent signal and the n previous signals are consistent, the new confirmed signal is set to the received recent signal; and condition 2: when the result from step A indicates the received recent signal and the n previous signals are not consistent, the new confirmed signal is set to a previous confirmed signal.

In order to achieve step A and step B, it is not necessary to have a logical "if" operation; for example, in the embodiments, performing AND and OR logical operations to the received recent signals and n previous signals can also achieve step A and step B.

Other objects, advantages, and novel features of the invention will become more apparent from the following detailed description when taken in conjunction with the accompanying drawings.

BRIEF DESCRIPTION OF THE DRAWINGS

FIG. 6 is a schematic drawing of logical operations according to the present invention.

FIG. 7 is another schematic drawing of logical operations according to the present invention.

FIG. 10 shows a signal noise reduction system performing logical operations to a plurality of pins.

DETAILED DESCRIPTION OF THE PREFERRED EMBODIMENT

Figure 3:
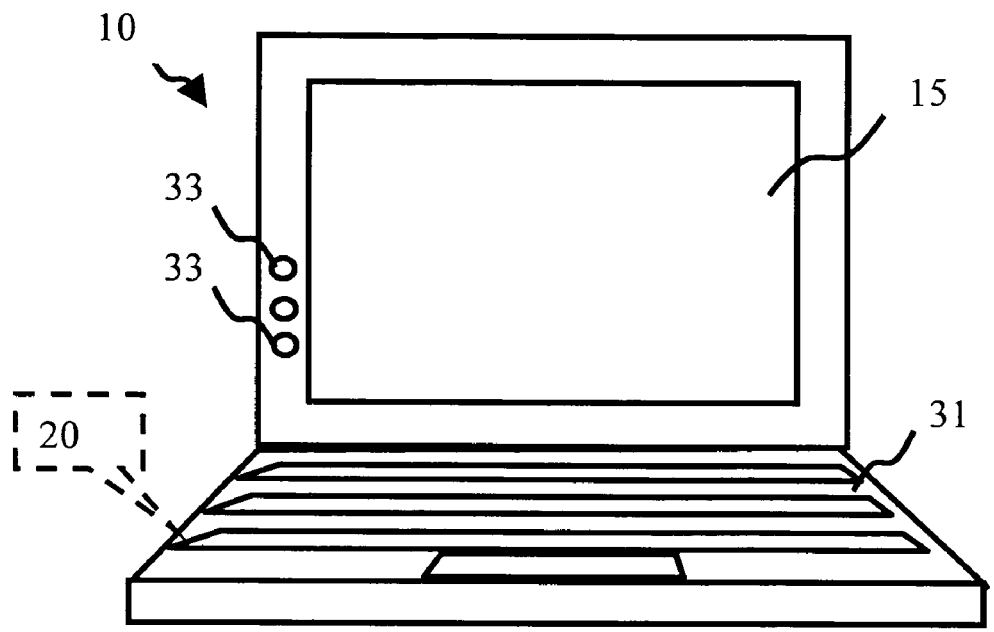
FIG. 3 shows a computer.
Figure 4:
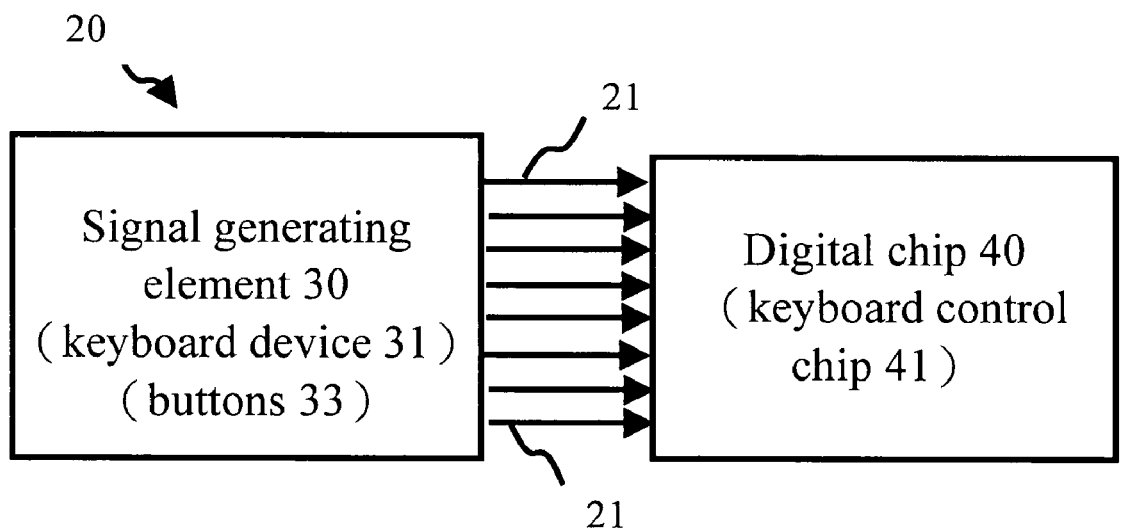
FIG. 4 shows a first embodiment of a signal noise reduction system in a computer according to the present invention.

Please refer to FIG. 3. A typical computer 10 has a screen 15, a keyboard device 31, some function keys 33, a motherboard (not shown), a memory (not shown), etc. Please refer to FIG. 4. FIG. 4 shows a first embodiment of a signal noise reduction system 20 in the computer 10. The signal noise reduction system 20 comprises a signal generating element 30 and a digital chip 40. The signal generating element 30, such as the keyboard device 31 or the function keys 33, is electrically connected to the at least one digital chip 40 (such as a keyboard control chip 41, which is basically pins of a GPIO).

Figure 1:
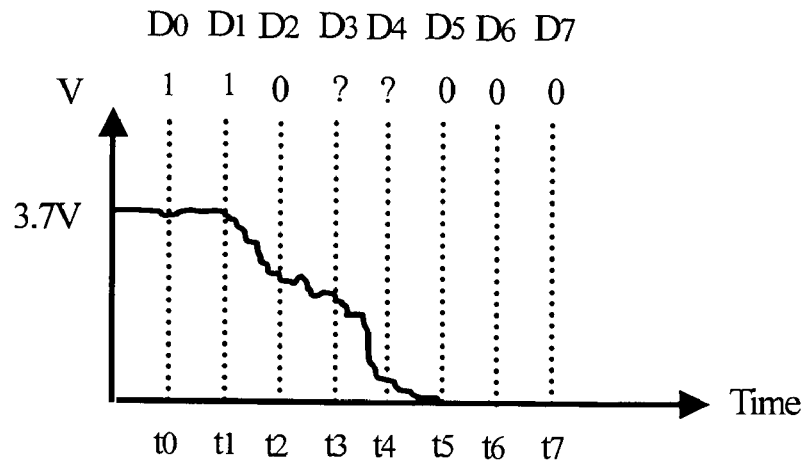
FIG. 1 is a schematic drawing of prior art technology processing signals.
Figure 2:
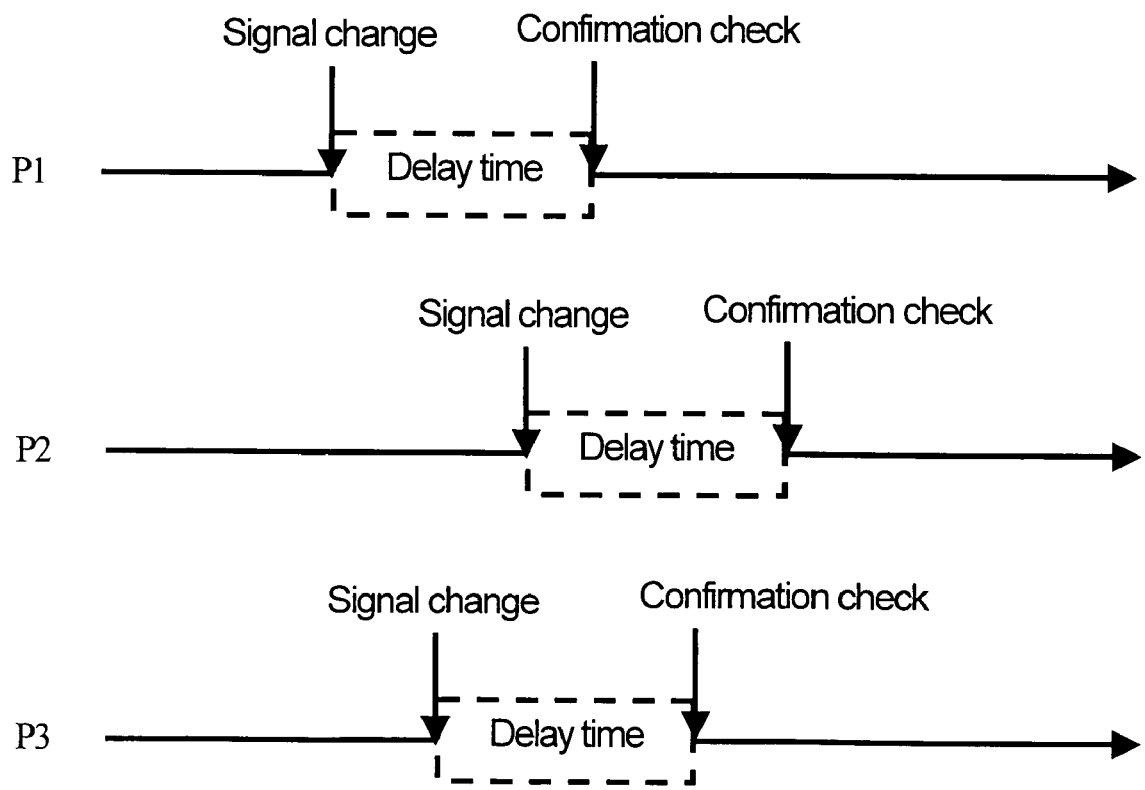
FIG. 2 is a schematic drawing of prior art technology processing three pins.
Figure 5:
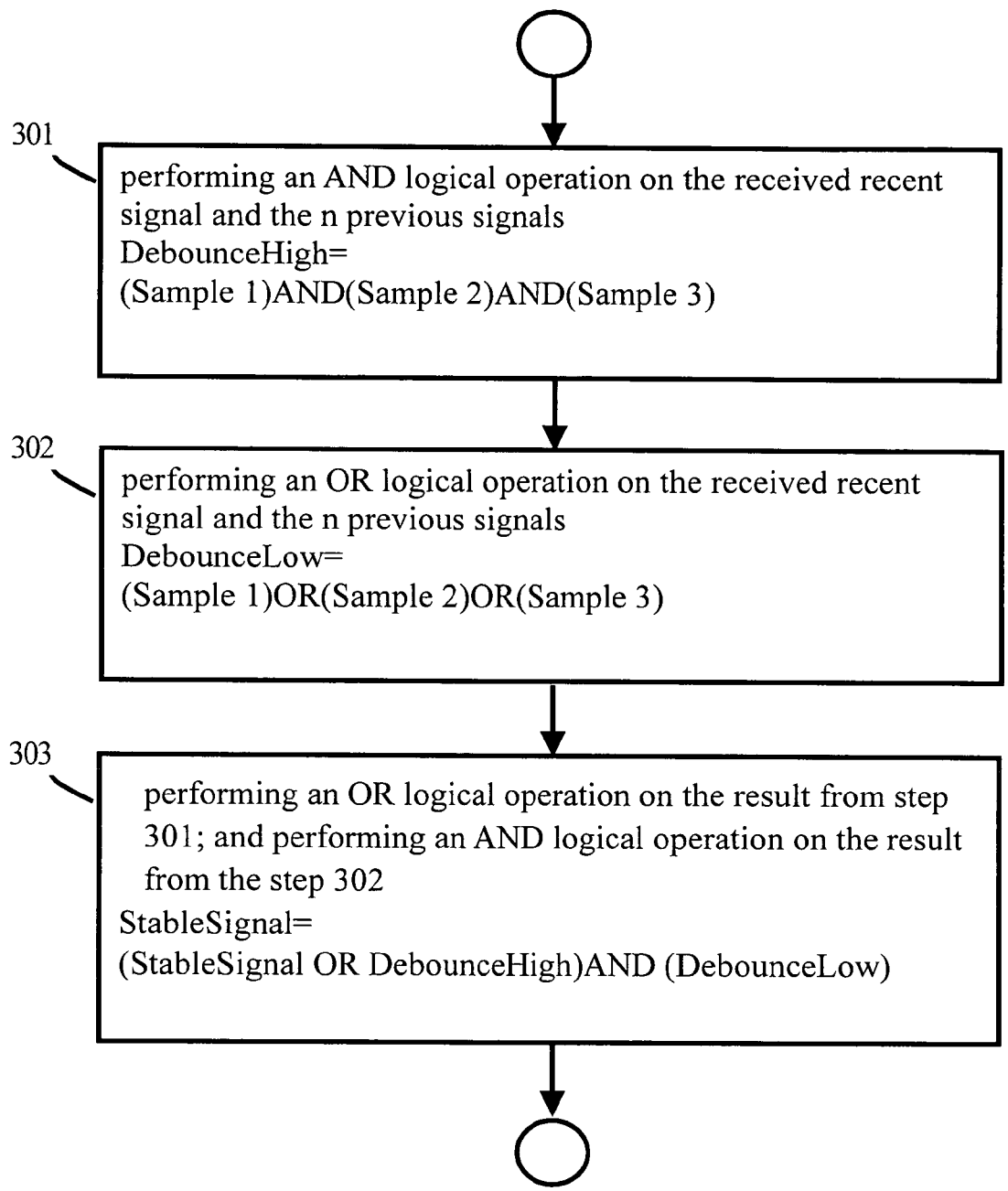
FIG. 5 is a flowchart of a method of signal noise reduction according to the present invention.

Please refer to FIG. 5. FIG. 5 is a flowchart of a method of signal noise reduction according to the present invention. This flowchart describes the signal processing performed by the signal generating element 30 and a connection line 21 of the digital chip 40. Samples shown in FIG. 1 indicate the signals generated by the signal generating element 30; "Sample 1" indicates the first signal, "Sample 2" indicates the second signal, and so on. DebounceHigh, DebounceLow and StableSignal are variables of the logical operations, wherein StableSignal indicates signals confirmed by the digital chip 40. Please refer to FIG. 6 and FIG. 7 for further description of the signal processing.

Step 301:

An AND logical operation is performed on the received recent signal and "n" previous signals; in this embodiment, n=2, so 3 Samples are selected; the corresponding formula is:

DebounceHigh=(Sample 1) AND (Sample 2) AND (Sample 3)

Please refer to FIG. 6. In the logical operation for Sample 1, Sample 2 and Sample 3, since each of Sample 1, Sample 2 and Sample 3 are "1", DebounceHigh(3)=1.

In the logical operation for Sample 2, Sample 3 and Sample 4, since Sample 4=0, DebounceHigh(4)=0.

Step 301 indicates that only when all Samples are "1", then DebounceHigh is "1"; under any other condition DebounceHigh is "0".

The above-mentioned "n" can be other values, but is preferably between 1 and 5. For example, when n=1, the corresponding formula is:

DebounceHigh=(Sample 1) AND (Sample 2)

Step 302:

An OR logical operation is performed on the received recent signal and "n" previous signals; the corresponding formula is:

DebounceLow=(Sample 1) OR (Sample 2) OR (Sample 3)

Please refer to FIG. 6. In the operation for Sample 1, Sample 2 and Sample 3, since all of Sample 1, Sample 2 and Sample 3 are "1", DebounceHigh(3)=1.

In the operation for Sample 4, Sample 5 and Sample 6, since Sample 4, Sample 5 and Sample 6 are all "0", DebounceLow (6)=0.

Step 302 indicates that only when all Samples are "0", then DebounceLow is "0", and under any other condition DebounceLow is "1".

Step 303:

An OR logical operation is performed with the previous confirmed signal and result from step 301, and then an AND logical operation is performed on the result from logical operation 302 and the result from step 302; the corresponding formula is StableSignal=(StableSignal OR DebounceHigh) AND (DebounceLow)

Please refer to FIG. 6. For example, in order to calculate StableSignal(3), assuming StableSignal(2)=1 (which means the previous confirmed signal was "1"), StableSignal(3)=(1 OR 1) AND (1)=1, so the new confirmed signal is 1.

By way of further example, StableSignal(6)=(1 OR 0) AND (0)=0, which indicates that the previous confirmed signal was "1", and the new confirmed signal is 0.

The formulas in the above-mentioned description may be explained as follows.

Step 301 and step 302 may be explained as: checking whether received recent signals and "n" previous signals are all consistent digital logical operations.

DebounceHigh is used for checking whether all Samples are 1, and DebounceLow is used for checking whether all Samples are 0. When all Samples are 1 (the signals are consistent), DebounceHigh=1 and DebounceLow=1; when all Samples are 0 (the signals are consistent), DebounceHigh=0 and DebounceLow=0.

When the signals are not consistent (some Samples are "1", some Samples are "0"), DebounceHigh=0 and DebounceLow=1.

Step 303 may be described as determining a new confirmed signal with digital logical operations based upon the previous confirmed signal and the results from step 301 and step 302, using the following two conditions:

Condition 1: If step 301 and step 302 find consistent signals, then the new confirmed signal is set to the recent signals and the previous confirmed signal is ignored.

Figure 8:
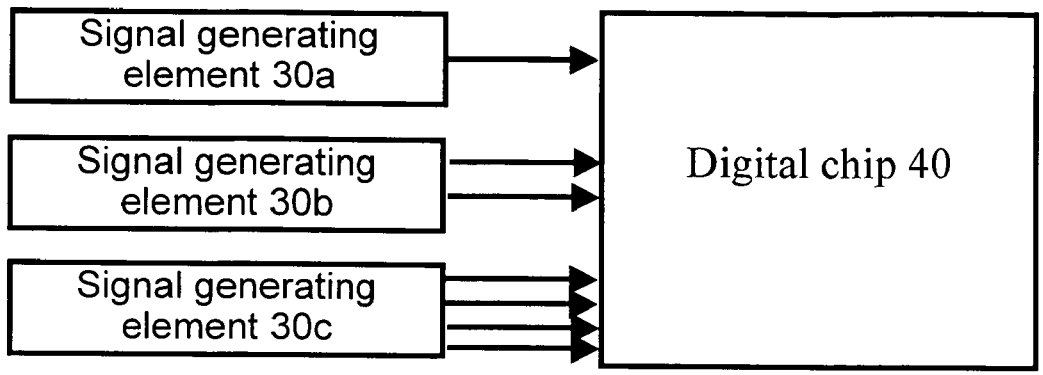
FIG. 8 shows a second embodiment of a signal noise reduction system in a computer according to the present invention.

For example, when all Samples are 1 (DebounceHigh=1, DebounceLow=1), then StableSignal=
  (StableSignal OR DebounceHigh) AND (DebounceLow)
  =(StableSignal OR 1) AND 1=1,
  and regardless of whether StableSignal (the previous confirmed signal) is "1" or "0", the new confirmed signal is "1".
  When all Samples are 0
  (DebounceHigh=0, DebounceLow=0), then StableSignal=
  (StableSignal OR 0) AND 0=0,
  and regardless of whether StableSignal (the previous confirmed signal) is "1" or "0", the new confirmed signal is "0".
  Condition 2: If step 301 and step 302 find non-consistent signals, the new confirmed signal is set to the previous confirmed signal. That is, StableSignal=(StableSignal OR DebounceHigh) AND (DebounceLow)
  =(StableSignal OR 0) AND 1=StableSignal
  It is noted that, since the signals are not consistent, DebounceHigh=0 and DebounceLow=1 may be assumed.
  Please refer to FIG. 6. When the signals are not consistent, such as when Sample 2=1, Sample 3=1 and Sample 4=0:
  StableSignal(4)=StableSignal(3)=1
  Please refer to FIG. 7. When the signals are not consistent, such as when Sample 2=0, Sample 3=0 and Sample 4=1:
  StableSignal(4)=StableSignal(3)=0.
  Please refer to FIG. 8. FIG. 8 shows a second embodiment of a signal noise reduction system in a computer according to the present invention. A difference between this embodiment and the first embodiment is that there is more than one signal generating element; for example, three signal generating elements 30a, 30b, 30c are all connected to the same digital chip 40.

Figure 9:
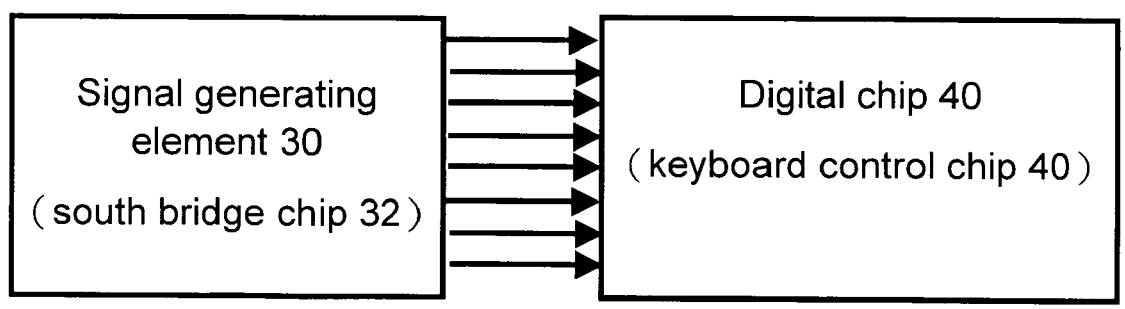
FIG. 9 shows a third embodiment of a signal noise reduction system in a computer according to the present invention.

Please refer to FIG. 9. FIG. 9 shows a third embodiment of a signal noise reduction system in a computer according to the present invention. A difference between this embodiment and the first embodiment is that the signal generating element 30 may be a south bridge chip 32 (or a north bridge chip), which means that non-GPIO pins can be used in the technology of the present invention.

Please refer to FIG. 10. FIG. 10 shows a signal noise reduction system performing logical operations to a plurality of pins. For example, when processing eight pins p1~p8, StableSignal for each pin can be calculated simultaneously. For example, an 8 bit system can calculate 8 pins simultaneously, and a 16 bit system can calculate 16 pins simultaneously, which is an advantage of the present invention.

The above-mentioned logical operations can be executed by the digital chip 40.

Although the present invention has been explained in relation to its preferred embodiment, it is to be understood that many other possible modifications and variations can be made without departing from the spirit and scope of the invention as hereinafter claimed. For example, when DebounceHigh=1, there is no need to calculate DebounceLow, and StableSignal may simply be set to "1"; and when DebounceLow=0, StableSignal may be directly set to "0". Of course, utilizing a logical "if" operation may reduce efficiencies, therefore, the embodiment of the present invention do not use the logical "if" operation.

What is claimed is:

1. A method of signal noise reduction for a digital chip to prevent errors when signal noise occurs, the method comprising:

step A: checking whether a received recent signal and n previous signals are all consistent with digital logical operations, wherein n previous signals provide a first signal to an nth signal prior to the received recent signal, and $1 \leq n \leq 5$;

step B: determining a new confirmed signal with digital logical operations according to a previous confirmed signal and a result from step A as follows:

condition 1: when the result from step A indicates the received recent signal and the n previous signals are consistent, the new confirmed signal is set to the received recent signal; and condition 2: when the result from step A indicates the received recent signal and the n previous signals are not consistent, the new confirmed signal is set to a previous confirmed signal.

2. The method as claimed in claim 1, wherein the digital logical operations in step A comprise the following two digital logical operations:

a logical operation A1 that performs an AND logical operation on the received recent signal and the n previous signals; and a logical operation A2 that performs an OR logical operation on the received recent signal and the n previous signals.

3. The method as claimed in claim 2, wherein the digital logical operation in step B comprise the following two digital logical operations:

a logical operation B1 that performs an OR logical operation to the previous confirmed signal and the result from the logical operation A1; and a logical operation B2 that performs an AND logical operation on the result from the logical operation B1 and the result from the logical operation A2.

4. A signal noise reduction system comprising:

at least one digital chip;

at least one signal generating element, wherein the at least one signal generating element is electrically connected to the at least one digital chip and sends signals to the at least one digital chip;

characterized in that the at least one digital chip utilizes a method of signal noise reduction to prevent errors when signal noise occurs, the method comprising:

step A: checking whether a received recent signal and n previous signals are all consistent with digital logical operations, wherein the n previous signals provide a first signal to an nth signal prior to the received recent signal, and $1 \leq n \leq 5$;

step B: determining a new confirmed signal with digital logical operations according to a previous confirmed signal and the result from step A as follows:

condition 1: when the result from step A indicates the received recent signal and the n previous signals are consistent, the new confirmed signal is set to the received recent signal; and condition 2: when the result from step A indicates the received recent signal and the n previous signals are not consistent, the new confirmed signal is set to a previous confirmed signal.

5. The signal noise reduction system as claimed in claim 4, wherein the digital logical operations in step A comprise the following two digital logical operations:

a logical operation A1 that performs an AND logical operation on the received recent signal and the n previous signals; and a logical operation A2 that performs an OR logical operation on the received recent signal and the n previous signals.

6. The signal noise reduction system as claimed in claim 5, wherein the digital logical operations in step B comprise the following two digital logical operations:

a logical operation B1 that performs an OR logical operation on the previous confirmed signal and the result from the logical operation A1; and a logical operation B2 that performs an AND logical operation on the result from the logical operation B1 and the result from the logical operation A2.

7. A computer comprising a plurality of digital chips and a plurality of signal generating elements, wherein at least one signal generating element is electrically connected to at least one digital chip and sends signals to the at least one digital chip, characterized in that at least one digital chip utilizes a method of signal noise reduction to prevent errors when signal noise occurs, the method comprising:

step A: checking whether a received recent signal and n previous signals are all consistent with a digital logical operation, wherein the n previous signals present a first signal to an nth signal prior to the received recent signal, and $1 \leq n \leq 5$;

step B: determining a new confirmed signal with digital logical operations according to a previous confirmed signal and the result from step A as follows:

condition 1: when the result from step A indicates the received recent signal and the n previous signals are consistent, the new confirmed signal is set to the received recent signal; and condition 2: when the result from step A indicates the received recent signal and the n previous signals are not consistent, the new confirmed signal is set to a previous confirmed signal.

8. The computer as claimed in claim 7, wherein the digital logical operation in step A comprises the following two digital logical operations:

a logical operation A1 that performs an AND logical operation on the received recent signal and the n previous signals; and a logical operation A2 that performs an OR logical operation on the received recent signals and the n previous signals.

9. The computer as claimed in claim 8, wherein the digital logical operations in step B comprise the following two digital logical operations:

a logical operation B1 that performs an OR logical operation on the previous confirmed signal and the result from the logical operation A1; and a logical operation B2 that performs an AND logical operation on the result from the logical operation B1 and the result from the logical operation A2.

10. The computer as claimed in claim 7, wherein the at least one signal generating element is a keyboard device, and the at least one digital chip is a keyboard control chip.

* * * * *